US 7,896,611 B2

Mar. 1, 2011

(12) United States Patent
Khanna et al.

(10) Patent No.: US 7,896,611 B2
(45) Date of Patent: Mar. 1, 2011

(54) HEAT TRANSFER DEVICE IN A ROTATING STRUCTURE

(75) Inventors: Vijayeshwar D. Khanna, Millwood, NY (US); Gerard McVicker, Stormville, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 1093 days.

(21) Appl. No.: 11/649,041

(22) Filed: Jan. 3, 2007

(65) Prior Publication Data
US 2008/0159853 A1 Jul. 3, 2008

(51) Int. Cl.
*F04D 29/58* (2006.01)
*H05K 7/20* (2006.01)

(52) U.S. Cl. ......... 415/177; 361/695; 361/697; 257/721; 257/722; 174/16.1; 174/16.3; 165/80.3; 165/185

(58) Field of Classification Search .................. 415/177, 415/178, 179, 199.2, 208.3; 361/695, 697; 257/721, 722; 174/16.1, 16.3; 165/80.3, 165/185
See application file for complete search history.

(56) References Cited

U.S. PATENT DOCUMENTS

| | | | |
|---|---|---|---|
| 3,844,341 A * | 10/1974 | Bimshas et al. | 165/86 |
| 4,131,157 A * | 12/1978 | Laing | 165/86 |
| 4,144,932 A * | 3/1979 | Voigt | 165/80.3 |
| 5,000,254 A * | 3/1991 | Williams | 165/85 |
| 5,867,365 A | 2/1999 | Chiou | |
| 5,884,691 A | 3/1999 | Batchelder | |
| 5,896,917 A | 4/1999 | Lemont et al. | |
| 6,175,495 B1 | 1/2001 | Batchelder | |
| 6,244,331 B1 | 6/2001 | Budelman | |
| 6,334,480 B1 | 1/2002 | Lim et al. | |
| 6,466,444 B2 * | 10/2002 | Cheung | 361/703 |
| 6,736,192 B2 | 5/2004 | Chang | |
| 6,876,550 B2 | 4/2005 | Sri-Jayantha et al. | |
| 7,481,263 B2 * | 1/2009 | Breier et al. | 165/80.4 |
| 2004/0035556 A1 | 2/2004 | Jean | |
| 2008/0225488 A1 * | 9/2008 | Khanna et al. | 361/701 |
| 2009/0199997 A1 * | 8/2009 | Koplow | 165/80.3 |

* cited by examiner

*Primary Examiner* — Nathaniel Wiehe
(74) *Attorney, Agent, or Firm* — Michael J. Buchenhorner, P.A.; Vazken Alexanian

(57) ABSTRACT

A cooling system includes a moving rotor system which in turn includes: a disk on which a plurality of heat conducting structures are distributed, the heat conducting structures having a cross section optimized for maximum surface area to footprint area; the heat conducting structures having a shape to optimize the heat transfer coefficient between the structures moving through the ambient fluid; and a mechanism for generating a mass fluid flow over the conducting structures so that the heat conducting structures are persistently cooled.

7 Claims, 18 Drawing Sheets

Temperature in a flow due to 3 cascading fins (each 2 mm long .25 mm thick)

Air Velocity

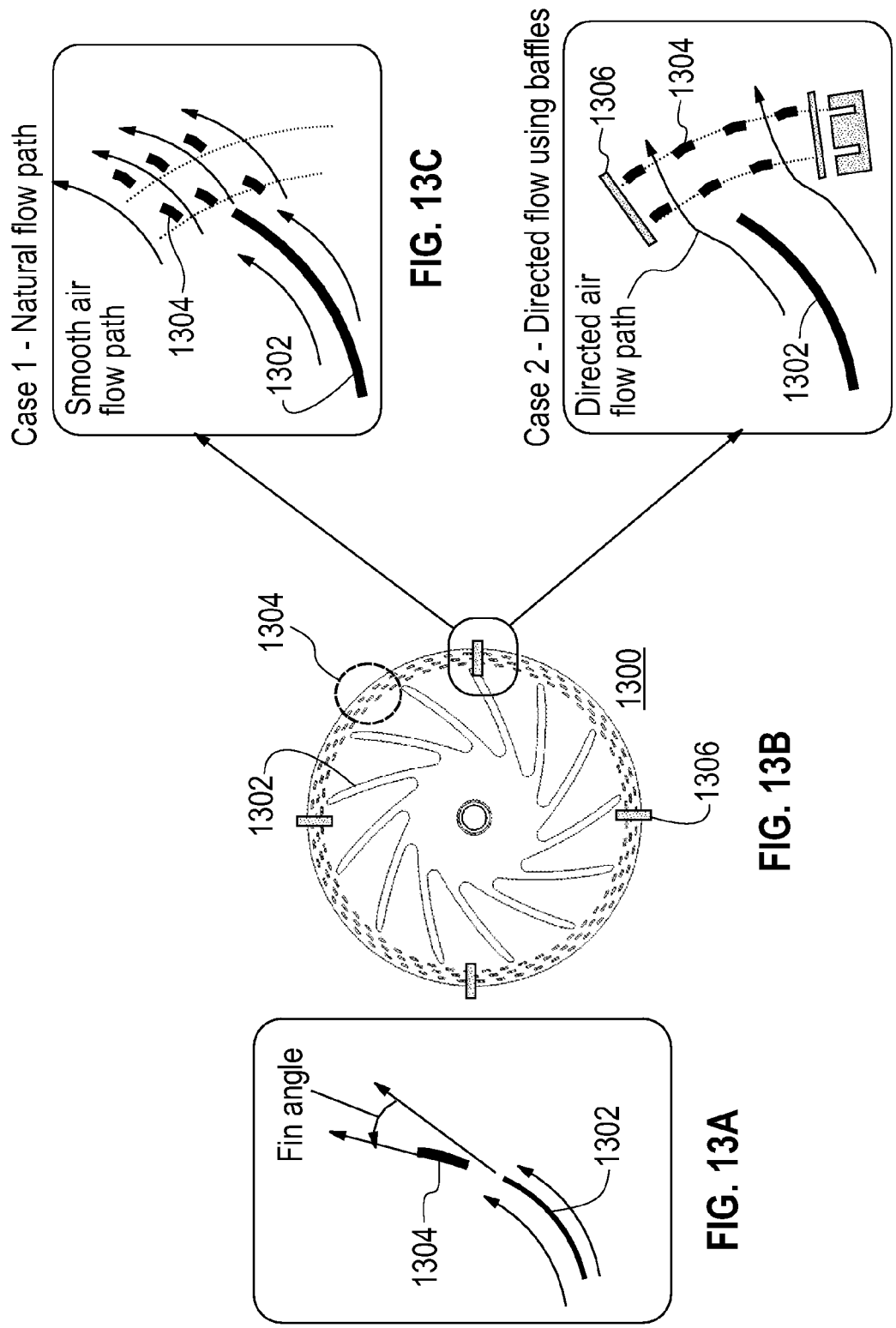

HEAT TRANSFER DEVICE IN A ROTATING STRUCTURE

CROSS-REFERENCE TO RELATED APPLICATIONS

Not applicable.

STATEMENT REGARDING FEDERALLY SPONSORED-RESEARCH OR DEVELOPMENT

Not applicable.

INCORPORATION BY REFERENCE OF MATERIAL SUBMITTED ON A COMPACT DISC

Not Applicable.

FIELD OF THE INVENTION

The invention disclosed broadly relates to the field of cooling devices and more specifically, to cooling devices for use in integrated circuits.

BACKGROUND OF THE INVENTION

The rotational motion of a metallic blade within a continuum of fluid (e.g., air) provides a heat transfer effect, but a straightforward construction is not sufficient to guarantee an efficient heat transfer apparatus. The blade geometry of the fan requires an appropriate structure to impart maximum heat to the ambient. A simple design where a conventional fan blade is replaced by a metallic material (with a heat conduction path) is limited in reducing the thermal resistance. A film heat transfer coefficient (h) of the order of 50 Watts/$m^2$K for a conventional fan blade must be increased by a factor of five (5) in order to achieve an attractive design for future electronic cooling applications.

FIGS. 1 and 19 show a prior cooling system. FIG. 1 shows a cooling system 100 comprising a metallic fan blade 104 attached to a rotating metallic shaft 105 which rotates within a thin fluid film 108. A heat source (e.g. a chip) 106 is soldered to a substrate 110 by solder balls 112 and connected to the casing 102 by thermal paste 114. The concept of using a heat dissipating surface to rotate in a stationary fluid is considered to provide enhancements to heat transfer mechanisms. The system is referred to as a Kinetic Heat Sink (KHS).

Referring to FIG. 19, an implementation of the cooling system 100 is shown. The metallic blade 104 is shown to have a spiral pattern. However, the heat generated by the chip 106 is not efficiently conducted away. Therefore, there is a need for a cooling system that overcomes the foregoing drawbacks.

SUMMARY OF THE INVENTION

Briefly, according to an embodiment of the invention, a cooling system includes a moving rotor system which in turn includes: a disk on which a plurality of heat conducting structures are distributed. The heat conducting structures have a cross section optimized for maximum surface to footprint area. The heat conducting structures further have a shape to optimize the heat transfer coefficient between the structures moving through the ambient fluid; and a mechanism for generating a mass fluid flow over the conducting structures so that the heat conducting structures are persistently cooled.

BRIEF DESCRIPTION OF THE DRAWINGS

FIGS. 13A-13D illustrate the directing of air flow over fins using baffles.

DETAILED DESCRIPTION

Fluid flow velocity through a rotating blade system can be decomposed into radial and tangential components. An embodiment leverages the tangential velocity component to maximize the film heat transfer coefficient. According to this embodiment, a blade structure consists of a metallic disc on which a multitude of fins or pins are distributed along concentric circles. The cross-section of the fins are optimized for maximum surface to footprint area (i.e., the area of the disk occupied by the blade). A pin with circular cross-section radius r makes the film heat transfer coefficient insensitive to airflow direction but an ultra small r could make the device mechanically weak. A thin near-rectangular (or arc-shaped) cross-sectioned fin allows large surface area for heat transfer feasible while maintaining its mechanical strength. But its geometry renders h to become sensitive to air-flow direction. The system takes advantage of the tangential velocity of a moving rotor system with arc-shaped thin-fins to maximize the "heat transfer coefficient" between the moving blade and the ambient fluid. The radial component provides the mass flow rate of the fluid through the rotating fins. According to an embodiment, a distributed group of baffles reduces the swirl component of the fluid, thereby maximizing the relative tangential velocity of the fluid with respect to the fin. The radial mass flow rate determines the temperature rise of the fluid as it travels through the rotating fins towards the exit.

Figure 1A:
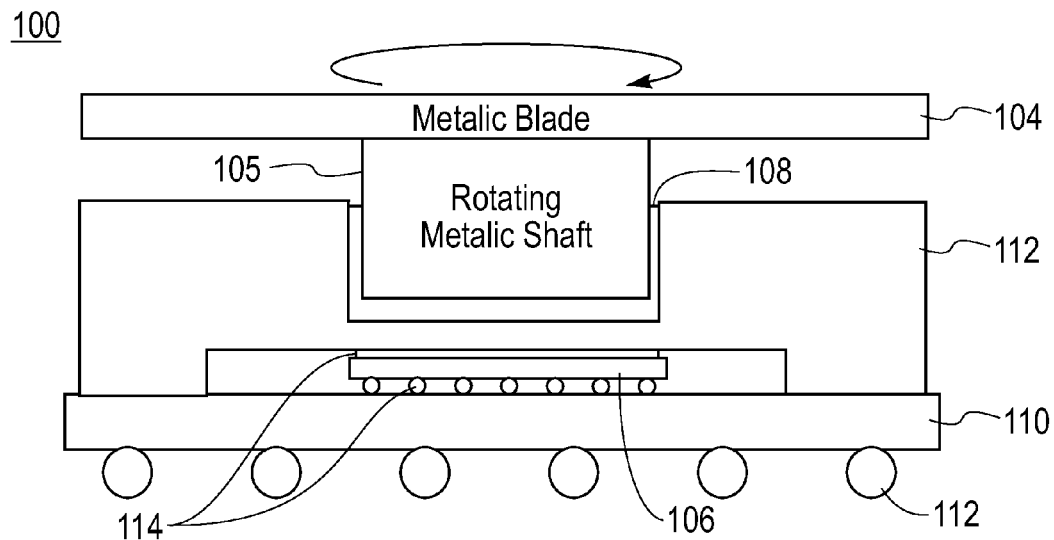
FIGS. 1 and 19 show a cooling system according to the known art.
Figure 1B:
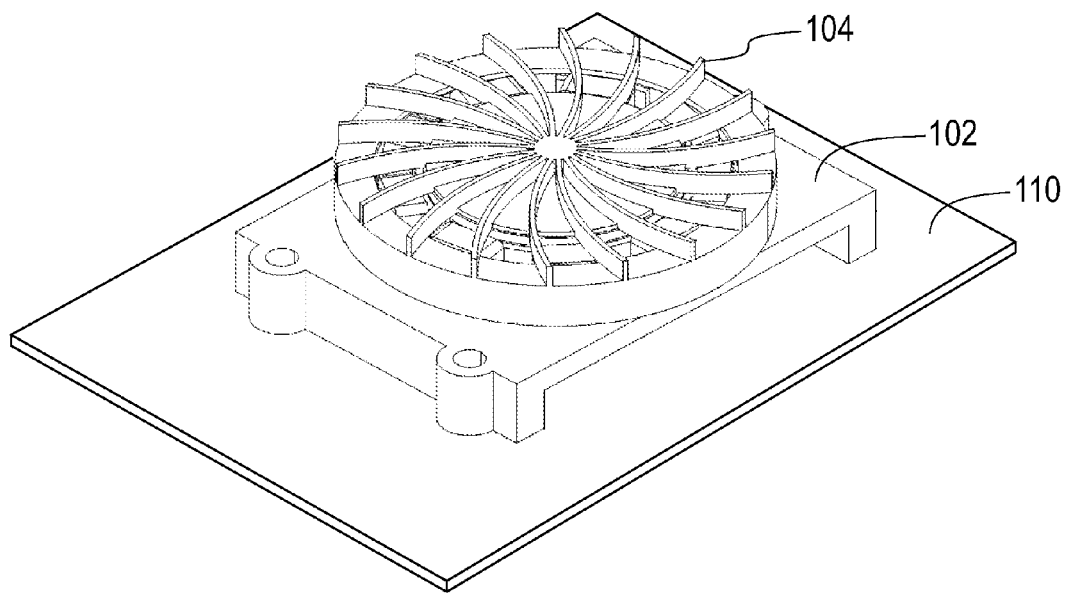
Figure 1:
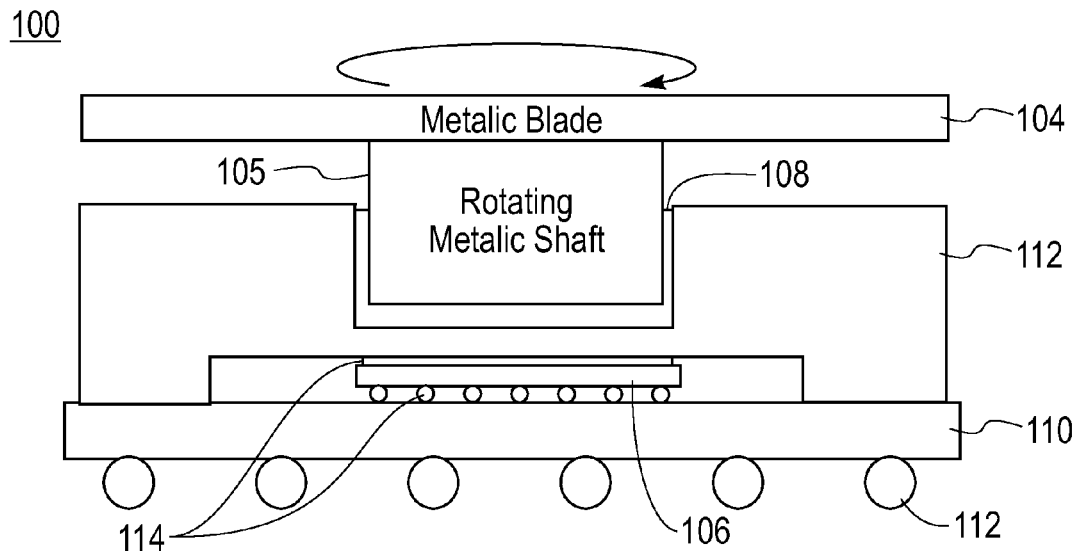
Figure 19:
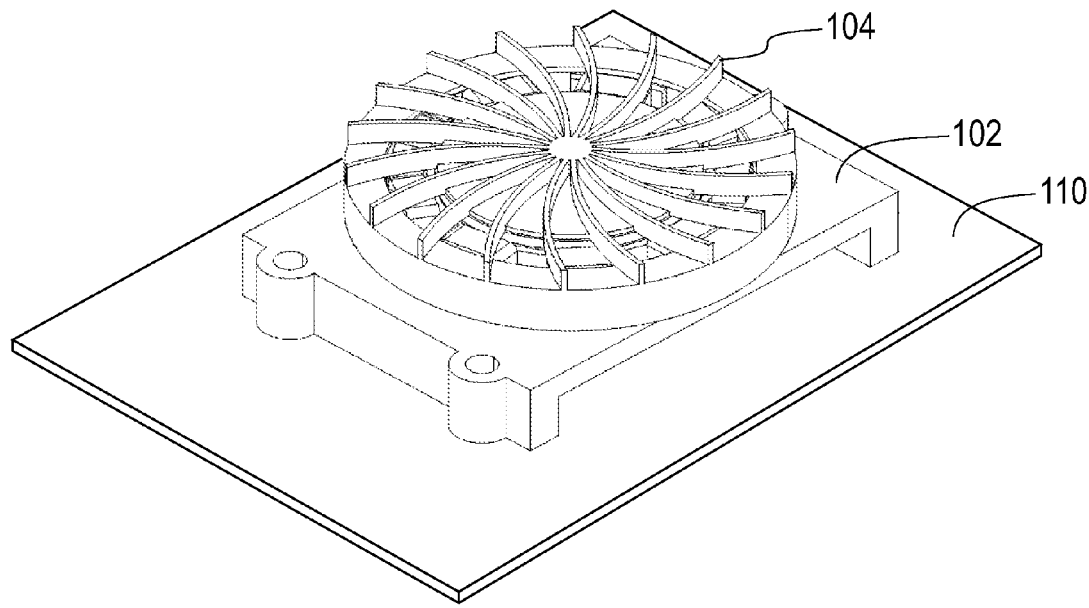
Figure 2:
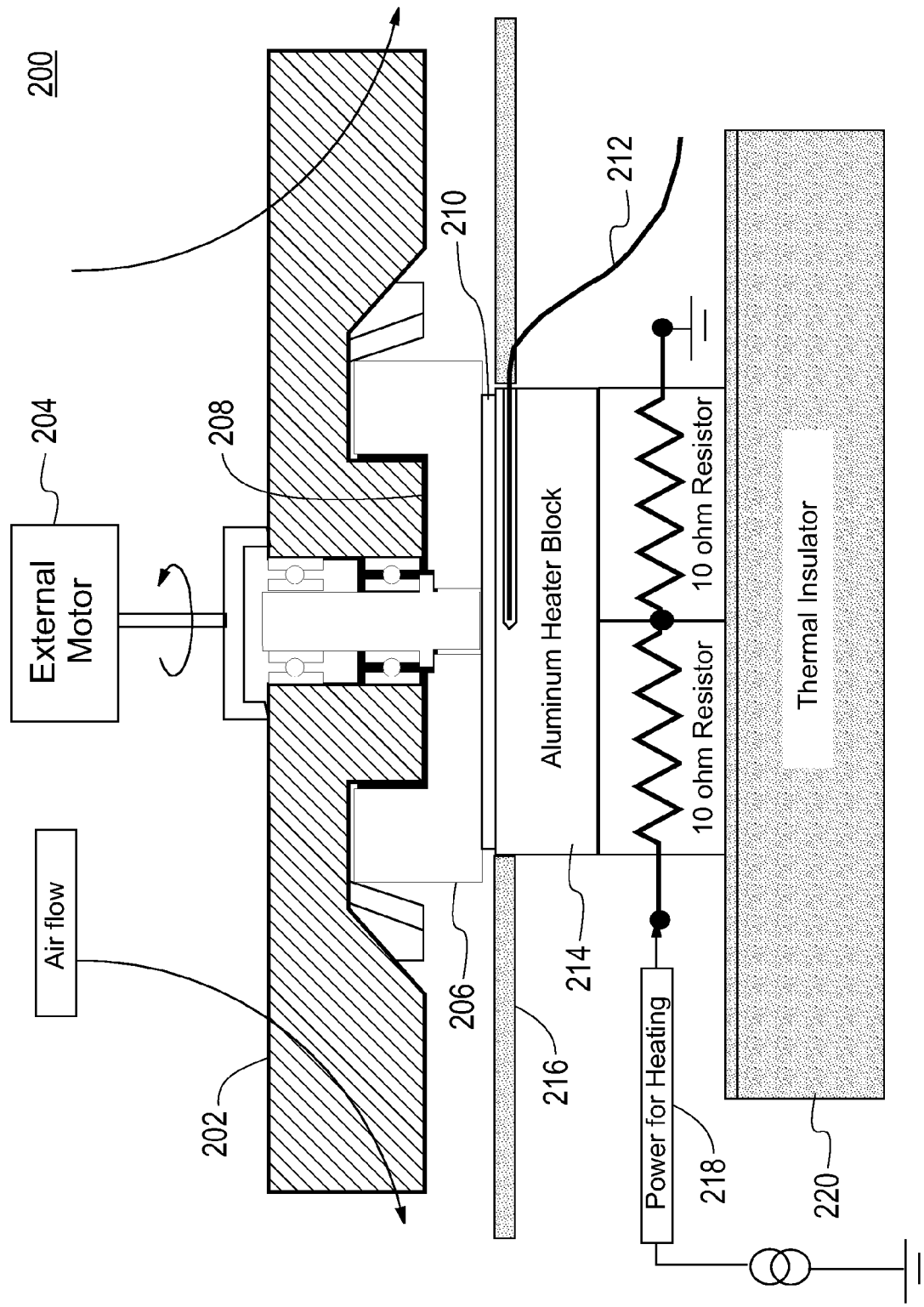
FIG. 2 shows an experimental setup for a cooling system.

FIG. 2 shows an experimental arrangement of a cooling system 200 according to an embodiment of the invention where rotating blades 202 are subject to a controlled heat flux generated by a set of two ten (10) ohm power resistors heated by a power supply 218. The blades 202 are driven by an external motor 204 to help estimate the thermal parameters of the selected blade structure. A self contained system will have a torque generating motor system integral to its design. The metallic blades 202 rotate within a fluid film 208 within a stationary structure 206. The blade structure is mounted on an aluminum heater block 214 by thermal paste 210. A thermocouple 212 is inserted into the heater block 214 to monitor the temperature of the system. In this experimental embodiment the amount of heat is determined by the value of the resistors and the power provided.

Figure 3A:
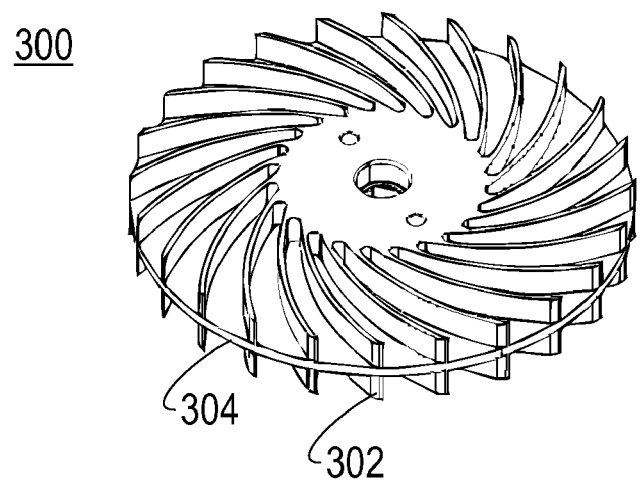
FIG. 3A is an isometric view of a fan blade tested.
Figure 3B:
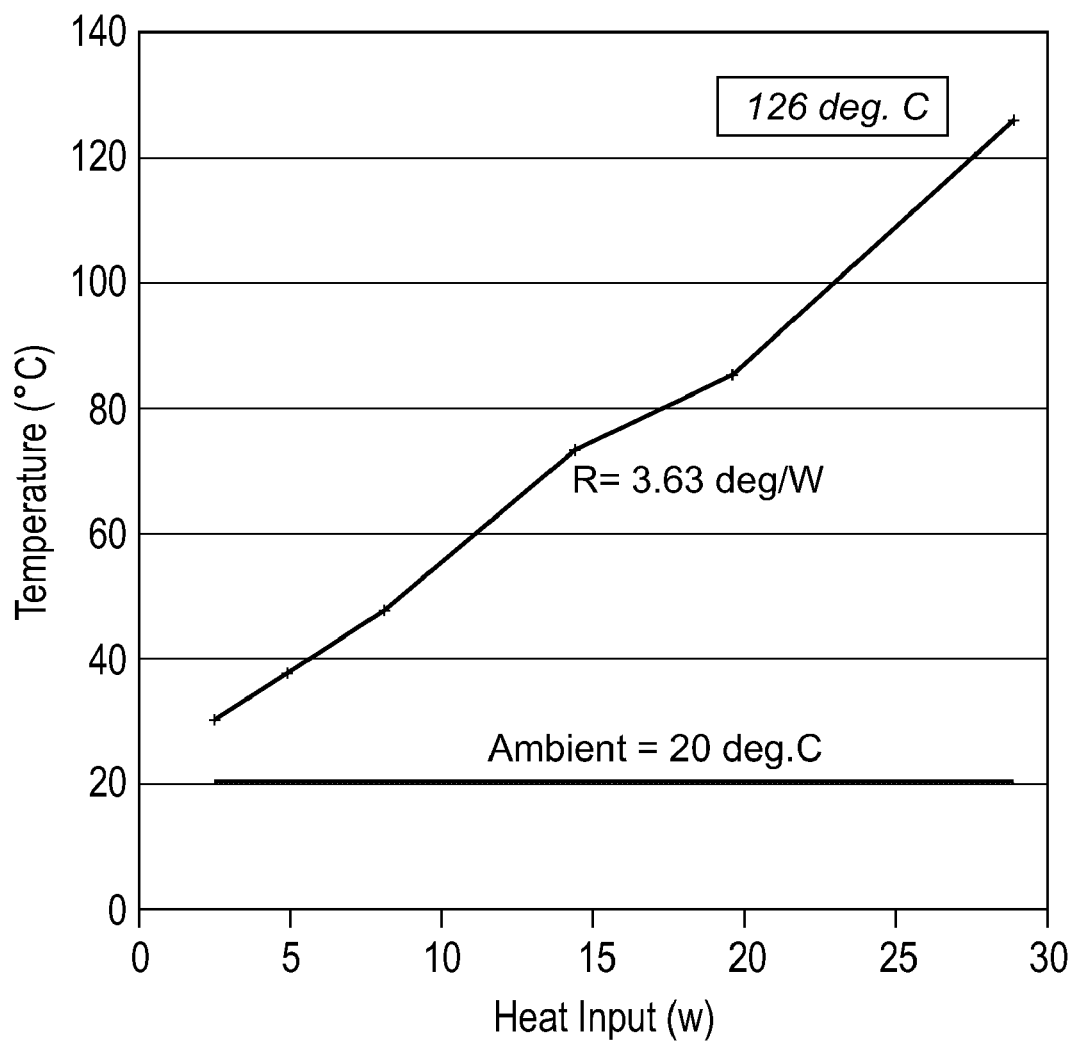
FIG. 3B is a graph of the measured thermal resistance (heat input versus temperature).

FIG. 3A shows a blade design that was tested. It comprises spiral blades 302 on a disc 304. The same blade that dissipates heat also generates the air flow. The temperature near the heat source is measured as a function of input power to the resistors, and is shown in a plot of temperature versus heat input in FIG. 3B. The slope of the plot determines the thermal resistance, and is approximately 3.63 degrees/W. For the apparatus to be of practical use in future cooling systems, the resistance must be taken below 1 degrees/W.

Figure 4A:
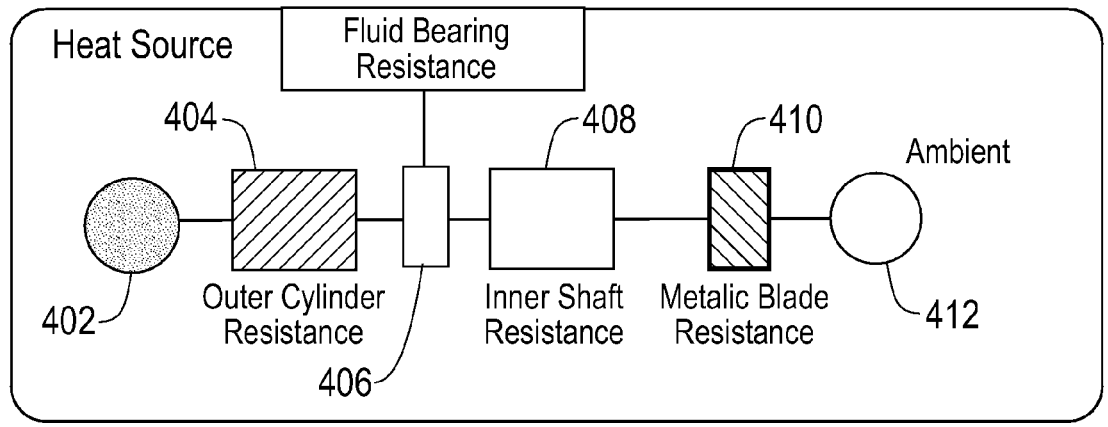
FIG. 4A is a block diagram of a one-dimensional heat flow.
Figure 4B:
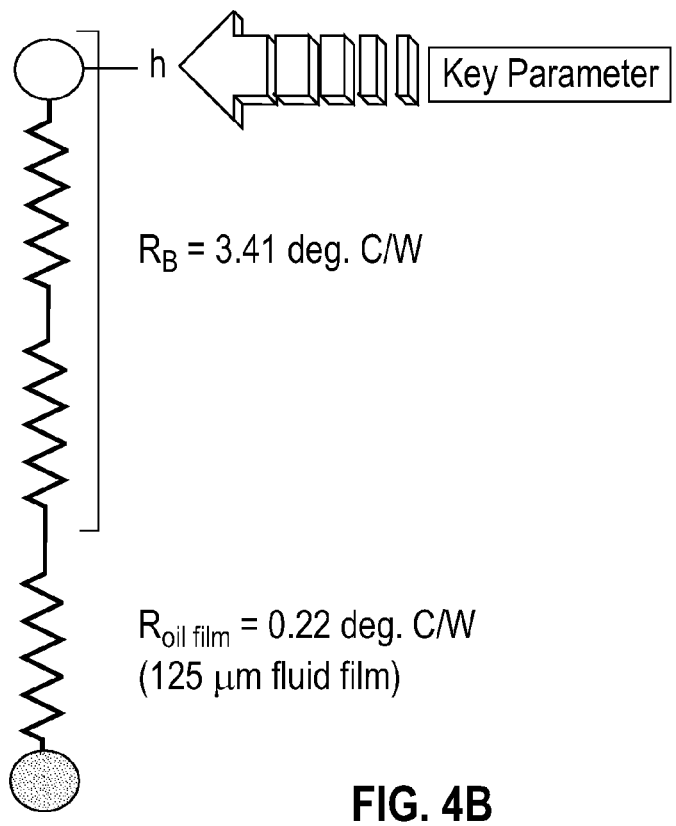
FIG. 4B shows the estimated resistance of the subassemblies of the KHS.

FIG. 4A shows a schematic description of one dimensional heat flow from one section to another of the KHS. The heat flux travels from a heat source 402 through the thermal interface material (TIM) and outer (stationary) cylinder 404 to the fluid film 406. The fluid film 406 provides the interface between the stationary and rotating members of the KHS assembly. The heat flux flows through the solid center portion 408 of the rotating blade 202 to the blade members 410 and eventually convects the flux to the ambient air 412. FIG. 4B shows the estimated resistance of the subassemblies. The effect of TIM is represented along with the outer cylinder 404. By comparing two cases, one with and another without oil film, it is possible compute the equivalent resistance of the dynamic film (=0.22 C/W). If static thermal conductivity were used to compute the oil film resistance it would be more than a factor of five (5) higher. Rapid mixing of oil within the 125 micrometer gap helps to reduce the equivalent resistance. The rest of the KHS system generated a resistance of 3.41 C/W. When the fan blades rotate slower a better thermal improvement is achieved.

Figures 5A, 5B:
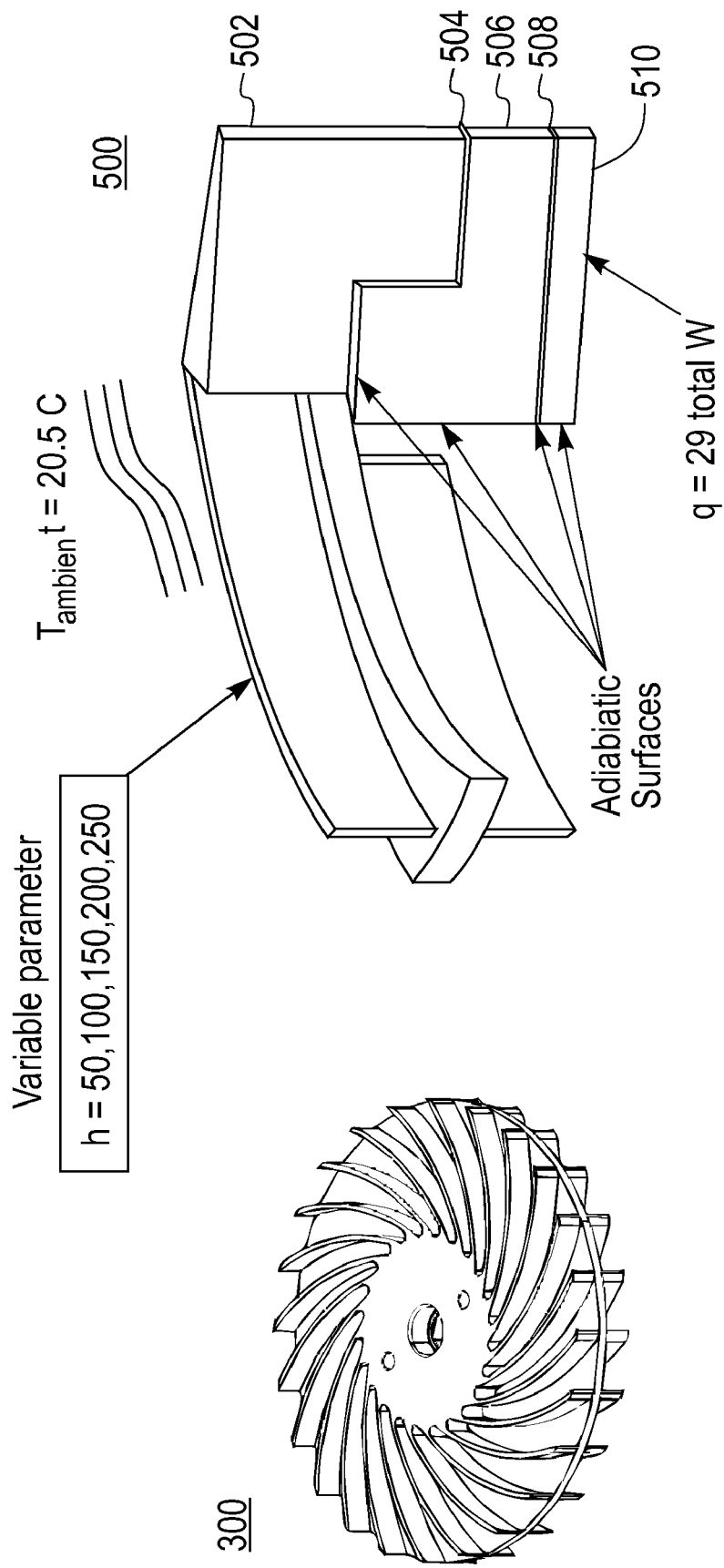
FIG. 5A is a perspective view of a fan blade.
FIG. 5B shows a cross section of the blade assembly of FIG. 5A.

FIGS. 5A and B show a KHS setup for a numerical study where the known thermal properties of the subassemblies were set as close to the experimental system, and the unknown thermal heat transfer coefficient, h, due to the convection effect being changed as a parameter. FIG. 5A shows a fan structure 300 (shown in FIG. 3). FIG. 5B shows a cross section of the blade assembly 500 comprising a blade 502, oil 504, conductor 506 and heat source 510.

Figure 6:
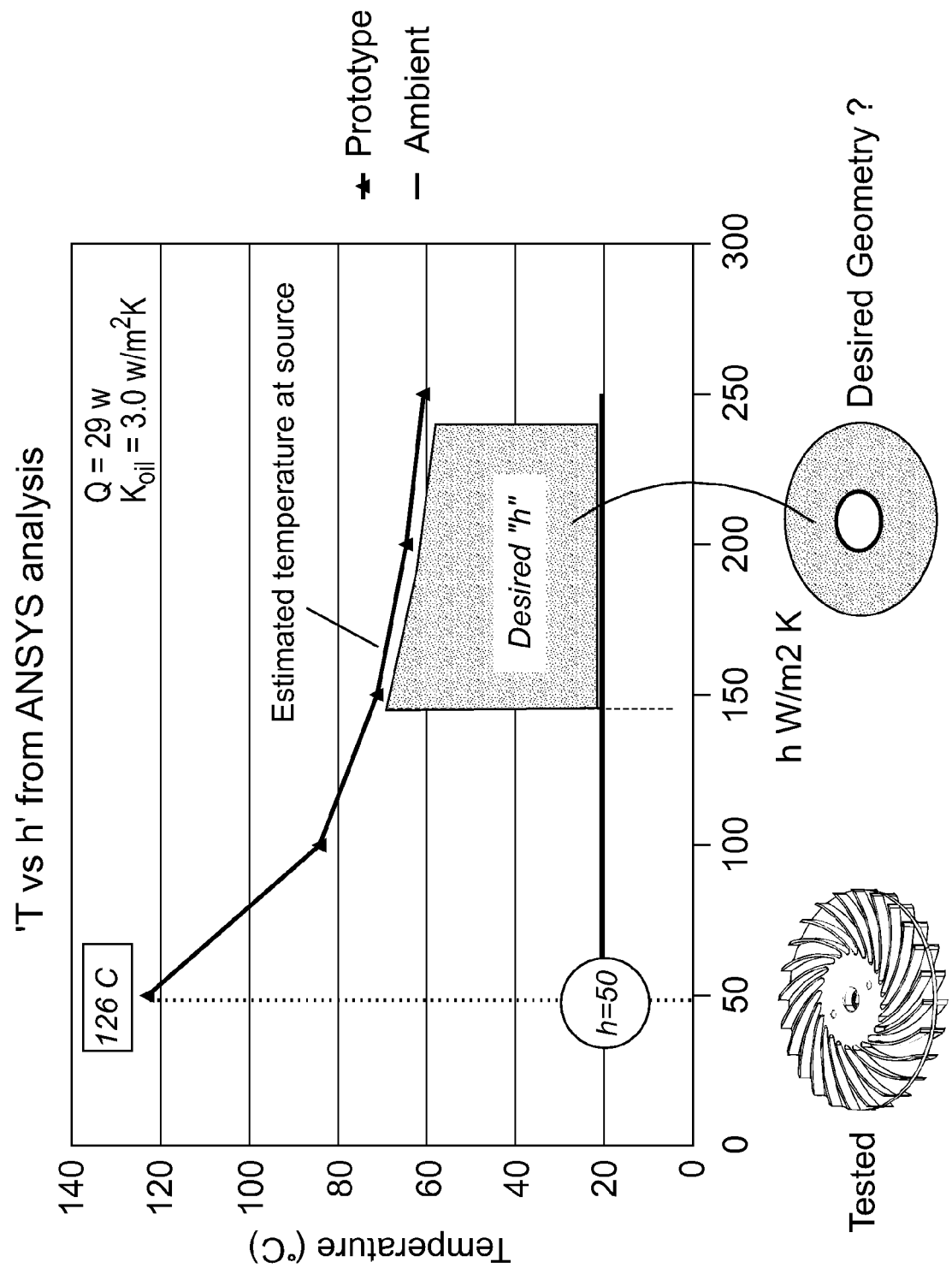
FIG. 6 is a plot of temperature vs. thermal conductivity "h" corresponding to a source temperature.

FIG. 6 shows the effect of thermal conductivity h on the source temperature. The observed value of 126 degrees C. at 29 W total power input matched the estimated results when h=50 W/m$^2$K. FIG. 6 illustrates an estimation of h. It also reveals that if the source temperature were to be kept near 70 degrees Celsius, then the h value must be increased to values above 150 W/m2K. It is well known that a continuous no-slip surface within a fluid flow field allows the boundary layer to grow. A boundary layer essentially means a near stagnant fluid layer above the heat conducting surface. Thus it is important to minimize the boundary layer build up.

Figure 7A:
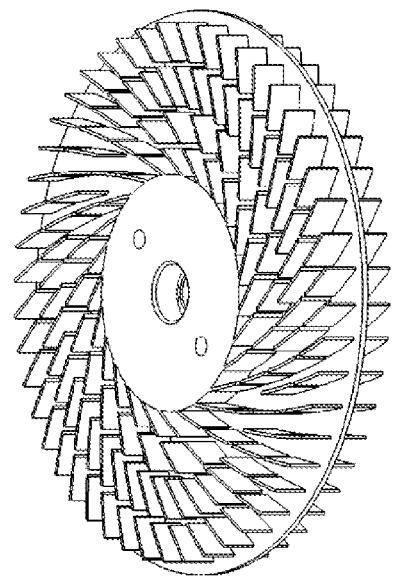
FIGS. 7A, 7B, and 7C show a simple modification to the tested blade structure where several slots are provided for the fluid to become detached from the surface.
Figure 7B:
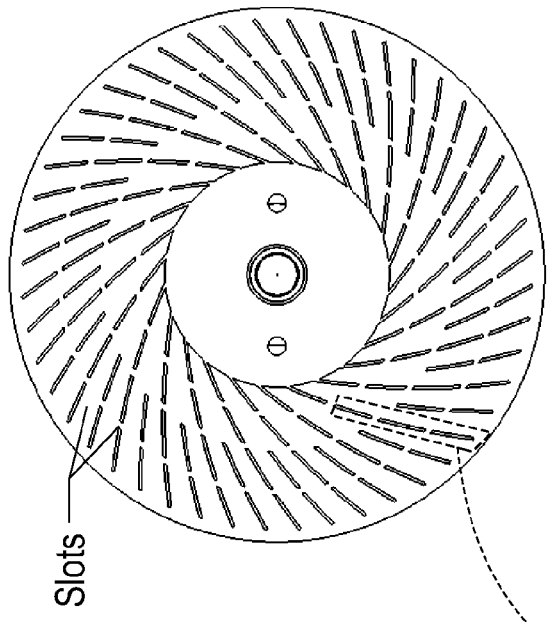
Figure 7C:
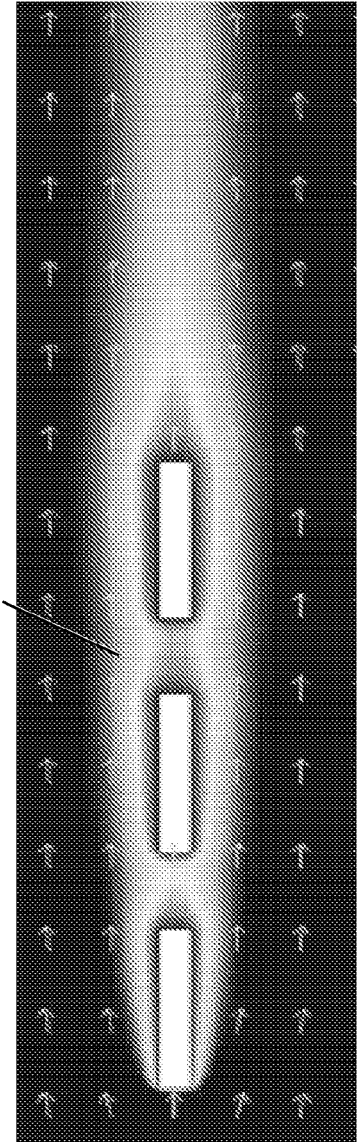

FIGS. 7A-C show a simple modification to the tested blade structure where several slots are provided for the fluid to become detached from the surface for reducing the boundary layer effect. FIGS. 7A and 7B show different views of a fan blade with a spiral pattern of fins. In FIG. 7B there is shown three cascading fins in the fan blade of FIG. 7A. A simple modification of the blade structure is made where several slots are provided for the fluid to become detached from the surface of the fan. FIG. 7C shows the temperature in a flow field due to the three cascading fins (each are 2 mm long and 0.25 mm thick).

Figure 8B:
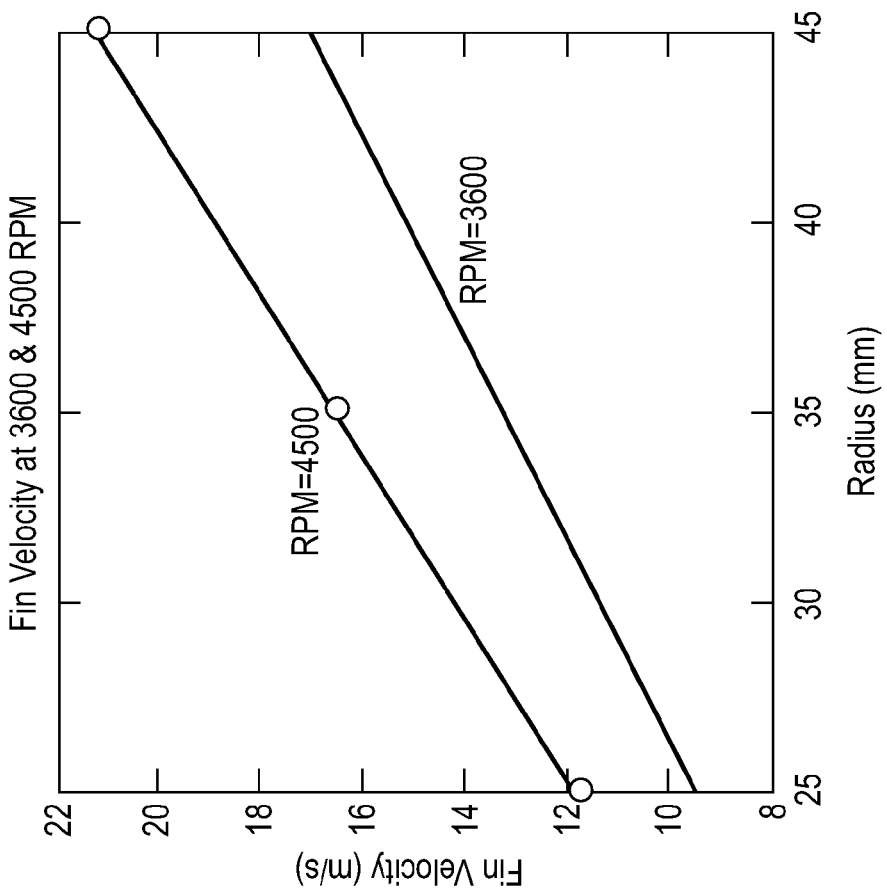
FIG. 8B is a graph showing the radius plotted vs. the fin velocity.
Figure 8A:
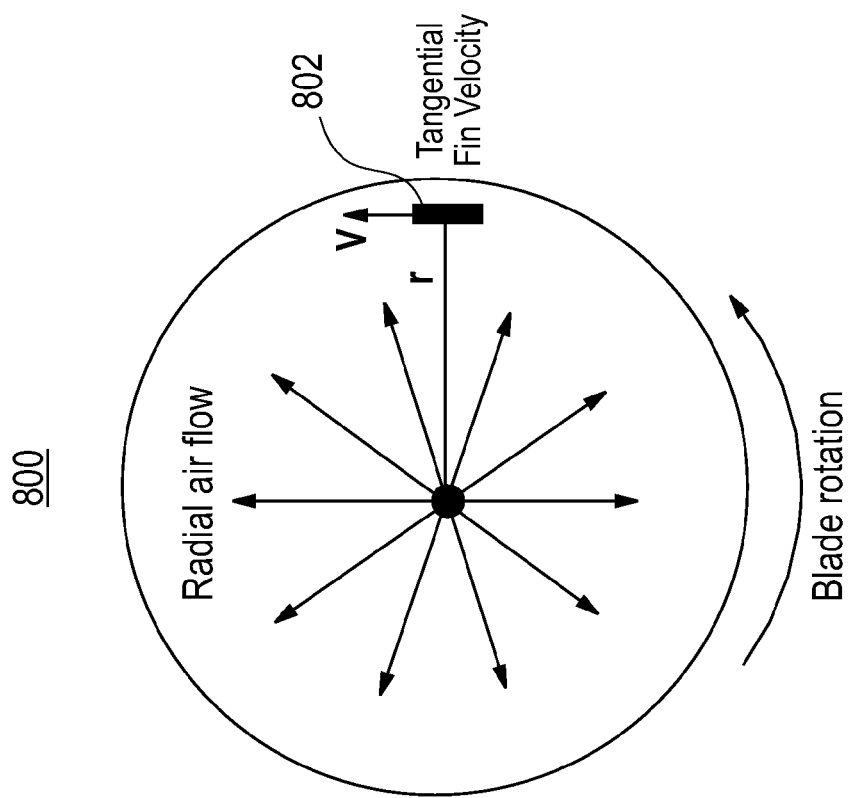
FIG. 8A is a top view of a rotating disk with a tangential fin.

FIG. 8A is a top view of a rotating disk 800. A fin 802 is attached to the rotating disk 800 at a distance d from the center of the disc 800. The rotating disc 800 has radial air flow shown by the arrows on the disc 800. From FIG. 8B it can be observed that a fin at, for example, a radius of 45 mm at 4500 rpm moves at 21 m/s. Therefore instead of producing a high velocity air flow with dependent acoustical challenges, we seek to optimize the geometry and deployment of fins over a rotating disc 800.

Figure 9B:
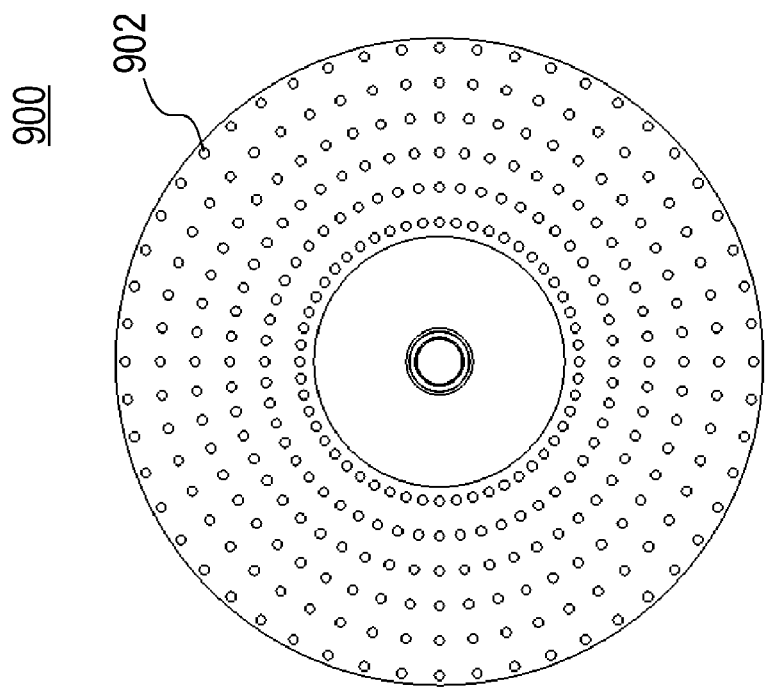
FIG. 9B is a top view of the disc of FIG. 9A.
Figure 9A:
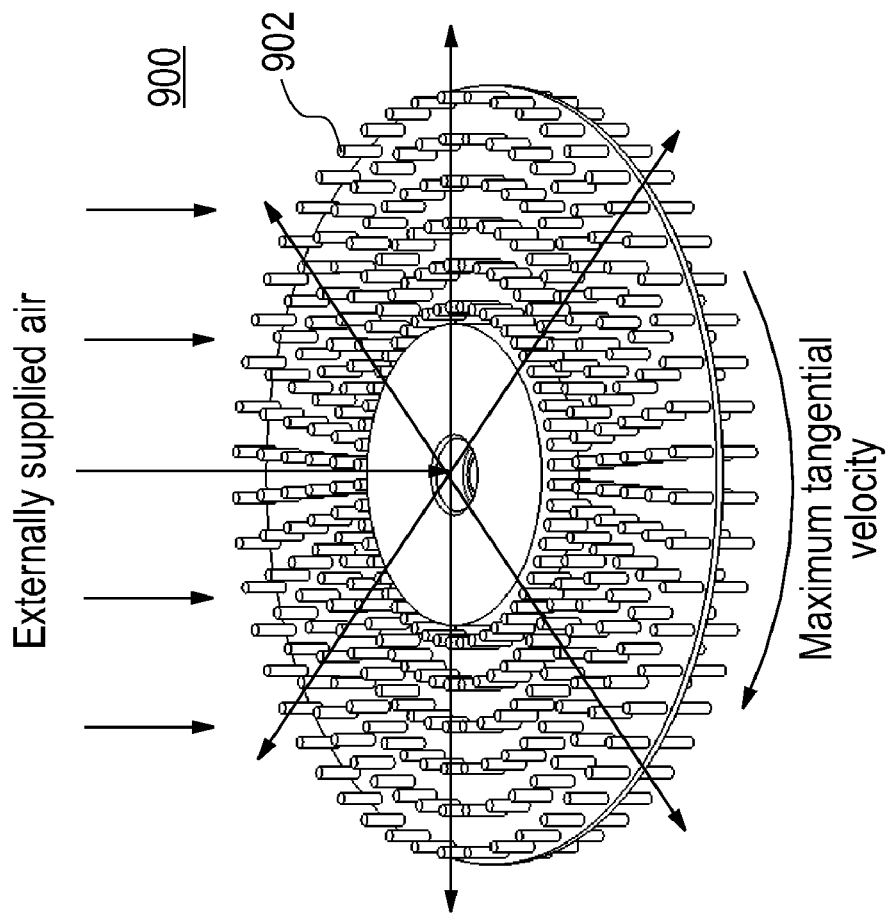
FIG. 9A is an isometric view of a disc with a pin-fin with externally supplied air flow

FIG. 9A is an isometric view of a disc 900 with pins 902 on the surface. The externally supplied air flow is approximately perpendicular to the surface of the disc 900. FIG. 9B is a top view of the disc 900. The air flow needed to remove the fin-driven heated air away from the KHS is assumed to be provided by an external source. For example the external air can be supplied axial-in/radial out direction. Alternative flow directions can be configured as well. Use of circular pins makes the outcome less sensitive to flow velocity direction. Since pin-fin (stationary) heat sinks exist today, it may be easier and cost effective to manufacture a KHS with this geometry.

Figure 10B:
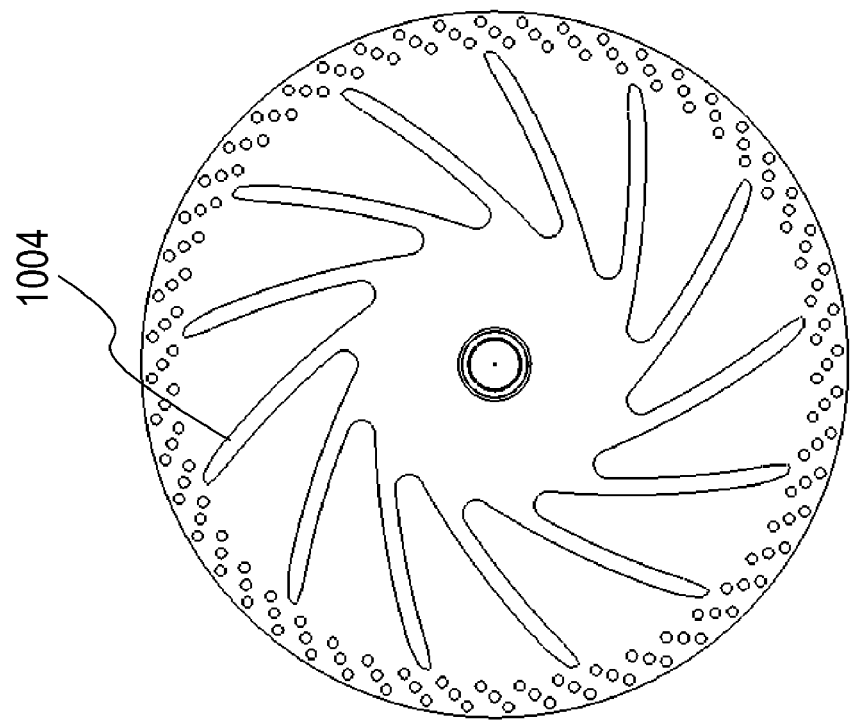
FIGS. 10A and 10B are modifications of FIGS. 9A and 9B where the air flow generating fan element is placed in the center of the blade structure.
Figure 10A:
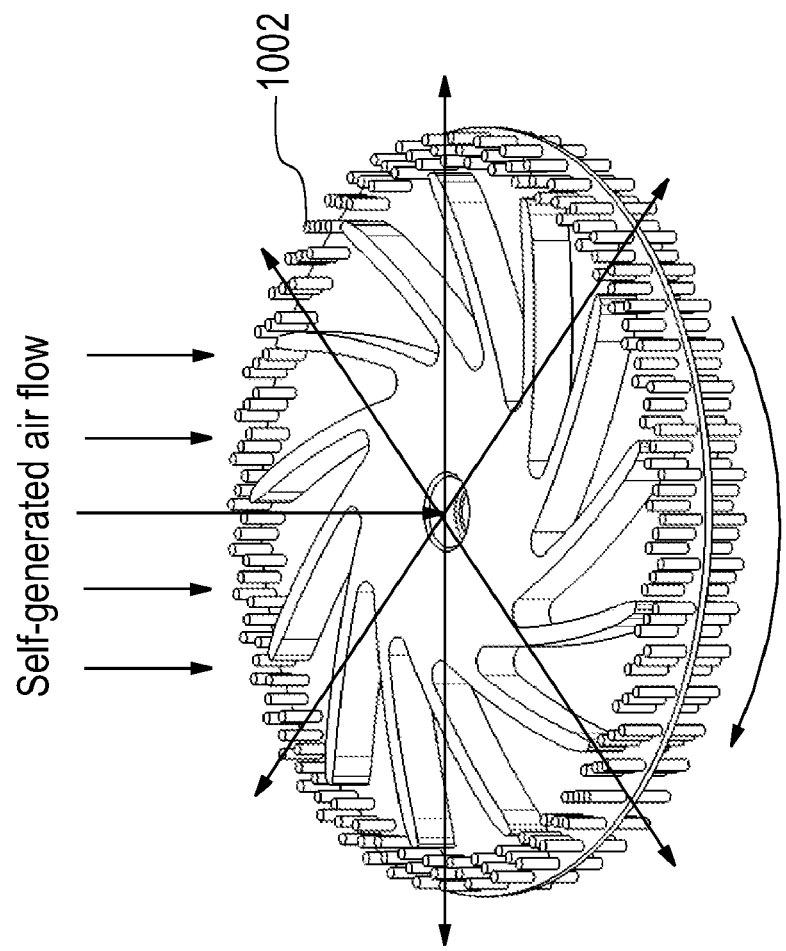

FIGS. 10A and 10B are modifications of FIGS. 9A and 9B where the air flow generating fan element is placed in the center of the blade structure. Hence, the mass flow rate of air is produced by the center element, and the heat transfer pins 1002 are placed at the outer perimeter of the disc. The inner part has a set of spiral fins 1002. the fan element self-generates air flow in an axial in, radial out pattern.

Figure 11B:
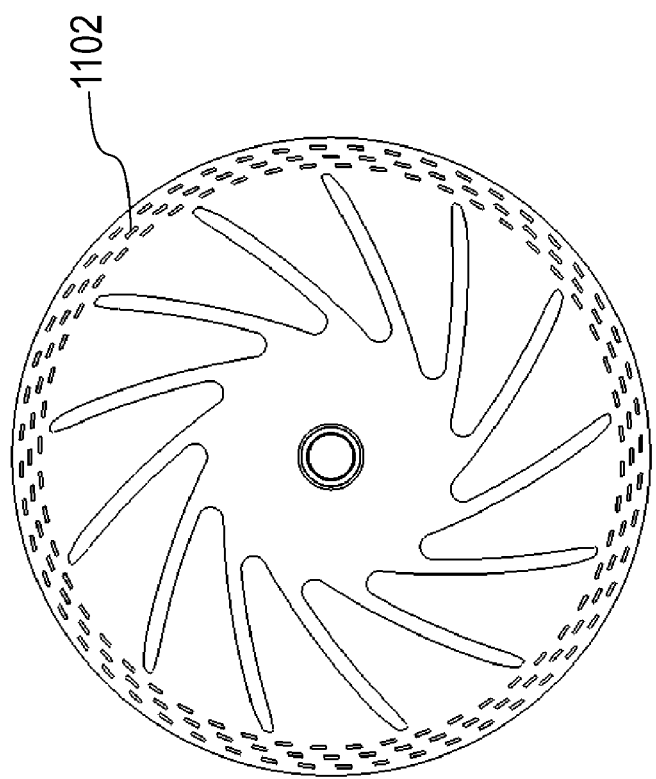
FIGS. 11A and 11B show a thin-fin on a disc.
Figure 11A:
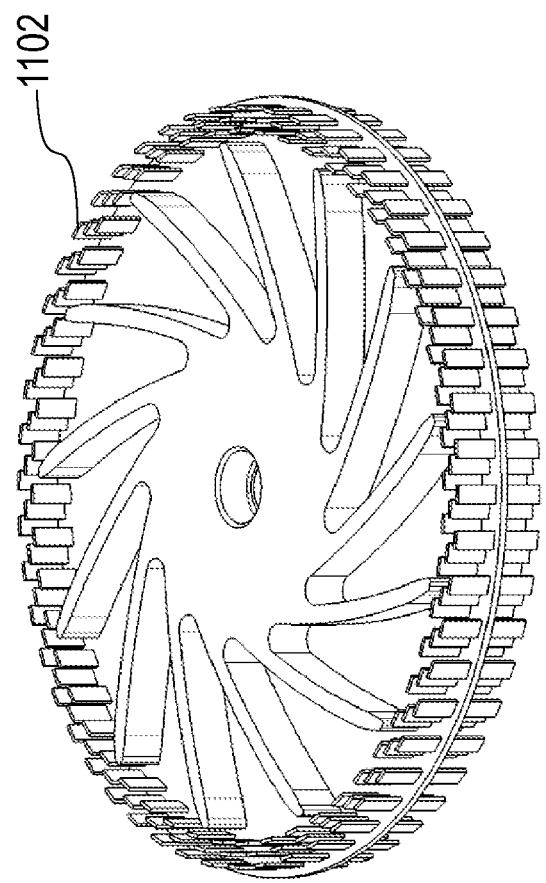

FIGS. 11A and 11B show a similar configuration to that of FIGS. 10A and 10B, except that the circular fins 1002 are replaced by thin-curved-rectangular cross-sectional fins 1102. Thin-fins 1002 can provide lower resistance to rotation while maximizing the heat transfer surface.

Figure 12C:
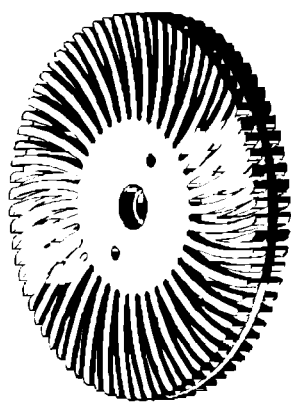
FIGS. 12A-F show a family of blade structures for KHS.
Figure 12E:
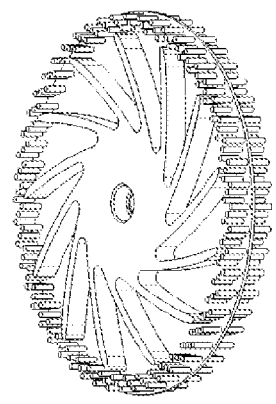
Figure 12F:
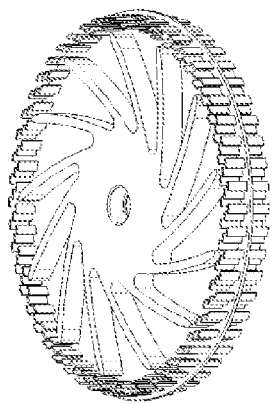
Figure 12B:
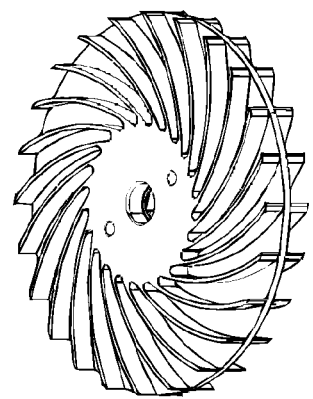
Figure 12D:
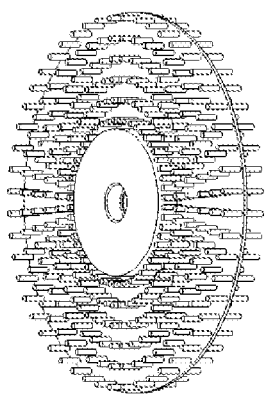
Figure 12A:
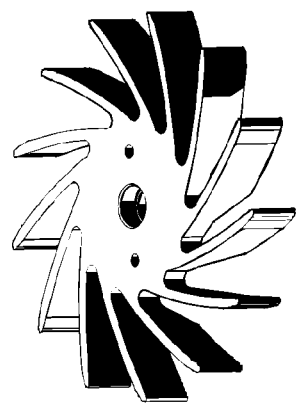

FIGS. 12A-12F disclose a family of blade structures each having a different trade-off. FIG. 12A is a basic blade structure made of a metallic material. This structure does not allow the heat to flow to the blade tip with ease of conduction, and is prone to blade vibration. FIG. 12B is an improvement where the center disk provides heat transfer path to the blade elements while reinforcing the stiffness of the blades against vibrations. FIG. 12C shows added partial blades that are meant to increase the surface area for thermal convection. Extensive measurements showed that the increase in blade surface area did not give a proportional increase in its heat transfer ability. It was observed that for a 50% increase in blade area, there was only a 25% increase in "area×h" parameter. FIG. 12D, 12E and 12F have already been discussed above.

It is important to maximize the relative air velocity with respect to the fins. Due to shear forces that arise within the fluid (air) media, the rotation of the disc/blade/fin could lead to a swirling motion of the free stream air. Significant swirl can reduce the relative velocity of air with respect to a fin.

FIGS. 13A-13D illustrate two extreme cases of fin orientation, as defined by fin angle, with respect to the blade exit direction. FIG. 13A shows a blade 1302 and a fin 1304 at an angle with respect to each other. FIG. 13B shows a top view of the disk 1300 with heat transferring fins 1304 and flow generating blades 1302. A set of stationary baffles 1306 is also shown. FIG. 13C (Case-1) shows the flow of fluid from the blade 1302 to the fin 1304 with no abrupt change in stream lines. In this case it is difficult to construct a system of baffles 1306 that will efficiently direct the air radially outward while exposing the fins 1304 to maximum tangential velocity with respect to the air. FIG. 13D (Case-2) allows the fins 1304 to have maximum exposure to tangential velocity while efficiently directing the mass-flow rate along the radial direction.

Figure 14:
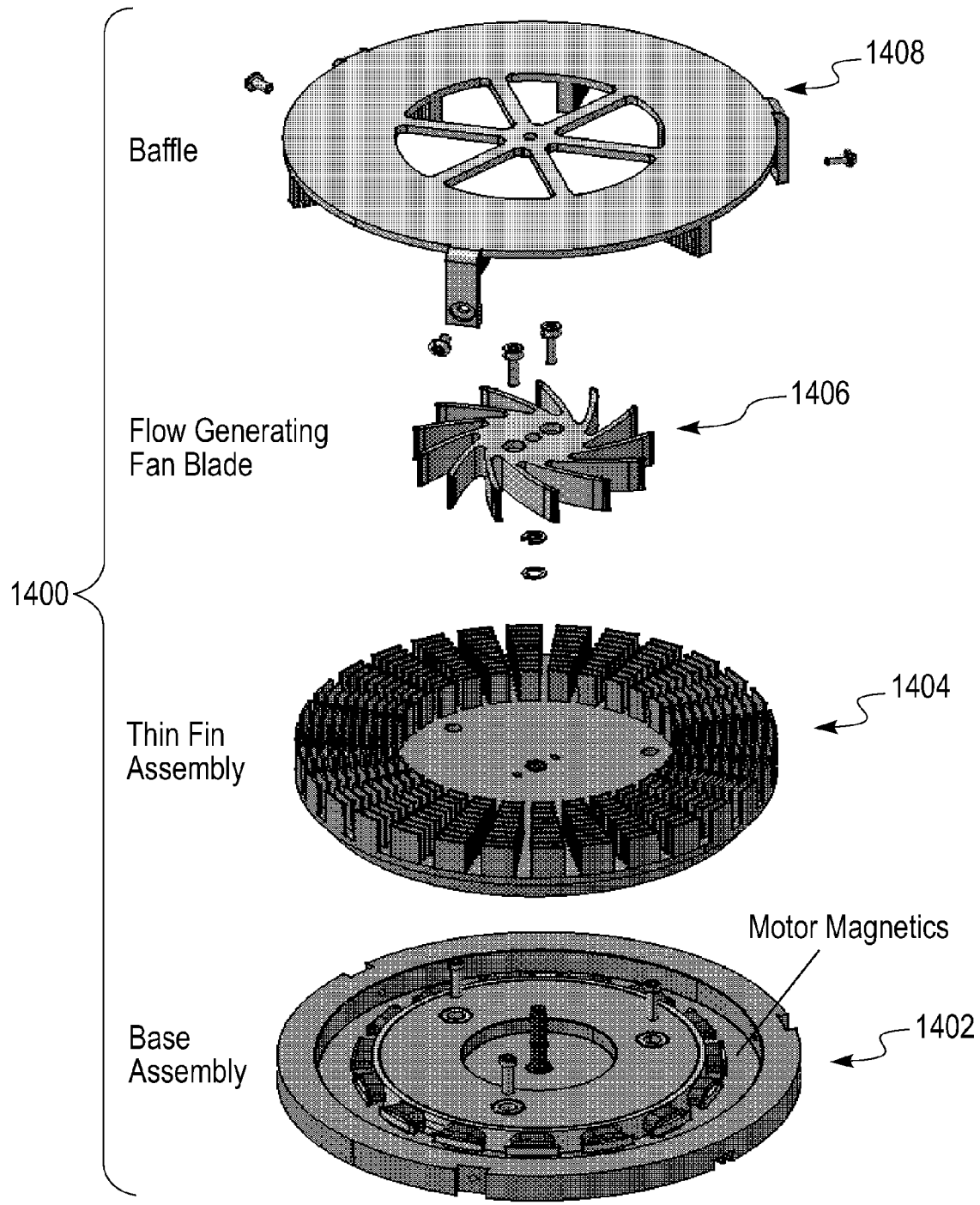
FIG. 14 shows an exploded view of a practical KHS with baffles.

FIG. 14 shows a practical construction of a KHS system 1400. The base assembly 1402 contains the center fixed shaft that would support the fin assembly 1404. It also houses the torque generating magnetics. The fin assembly 1404 can be made from a solid cylindrical piece made of copper, aluminum, or any other heat conducting material. A multitude of fins are concentrically distributed over the disc. The flow generating blade 1406 can be made integral to the disc with the same material, or else, it can be a distinct part made of cheaper material and assembled on to the disc. Finally the system of baffles 1408 contain flow directing baffles that mesh with rotating fins 1404. Closer tolerance control between stationary baffle 1408 fins and rotating fins can produce efficient heat transfer by peeling the fluid layer.

Figure 15:
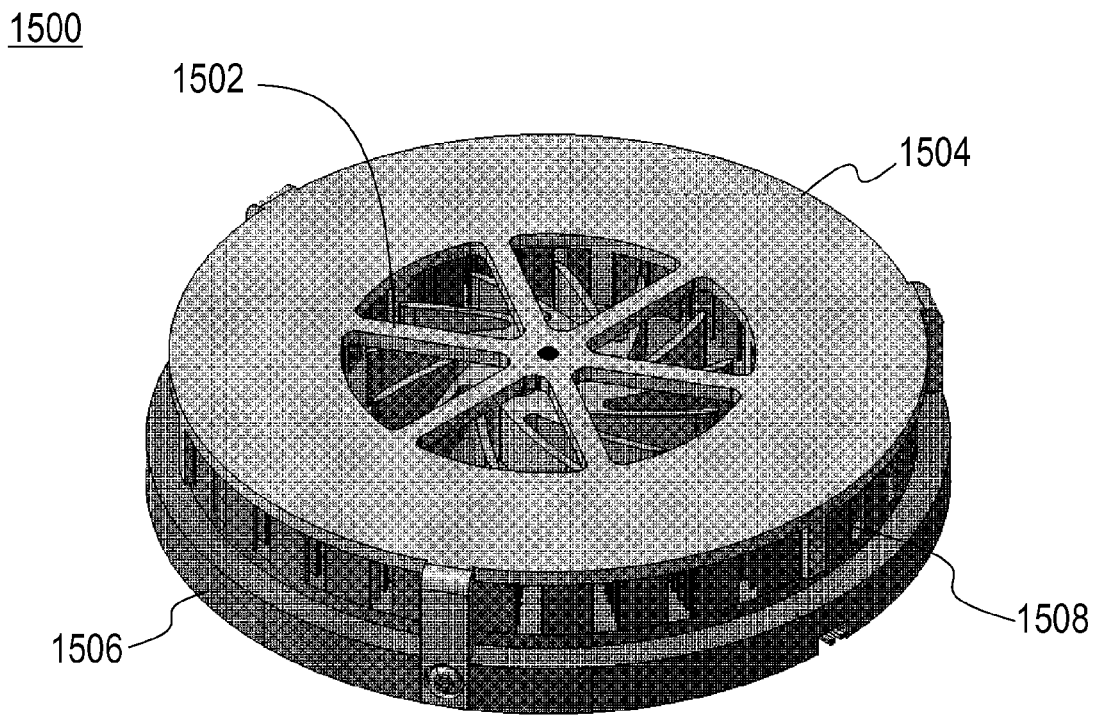
FIG. 15 shows an isometric view of an assembled KHS
Figure 16:
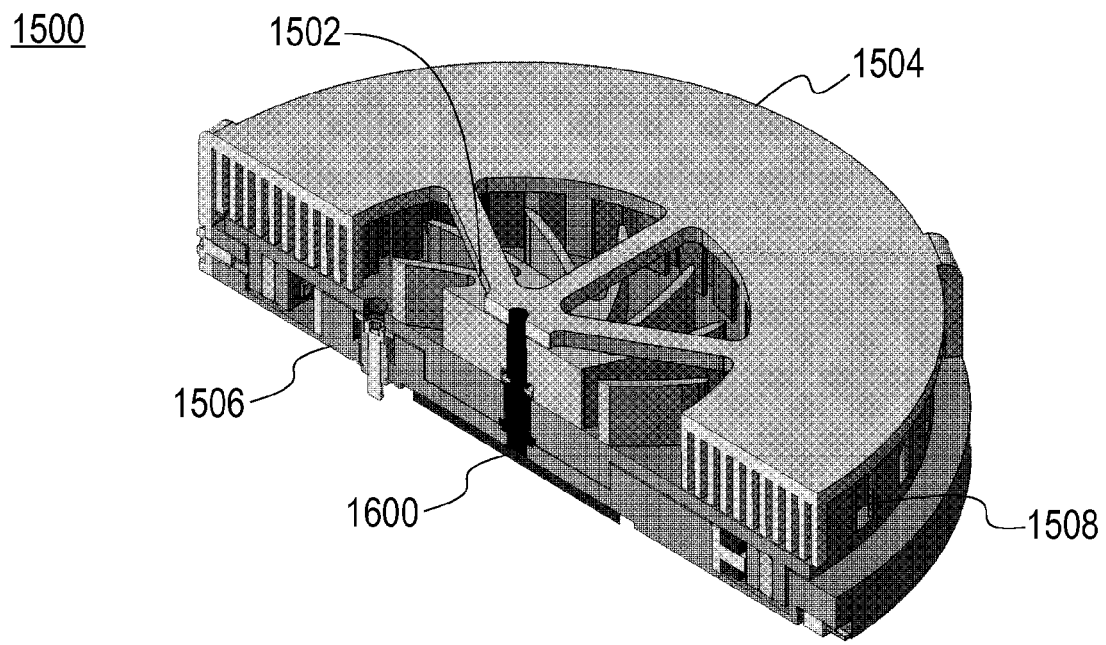
FIG. 16 is a sectional view of a KHS.

FIGS. 15 and 16 show fully assembled isometric and sectional-isometric views of the KHS. FIG. 15 shows a KHS 1500 comprising a flow generating fan blade 1502, a baffle 1504, a base assembly 1506, and a fin assembly 1508. FIG. 16 shows a cutaway section of the KHS 1500 showing a heat generating silicon die 1600, the fan blade 1502, a baffle 1504, the base assembly 1506, and fin assembly 1508.

Figure 17:
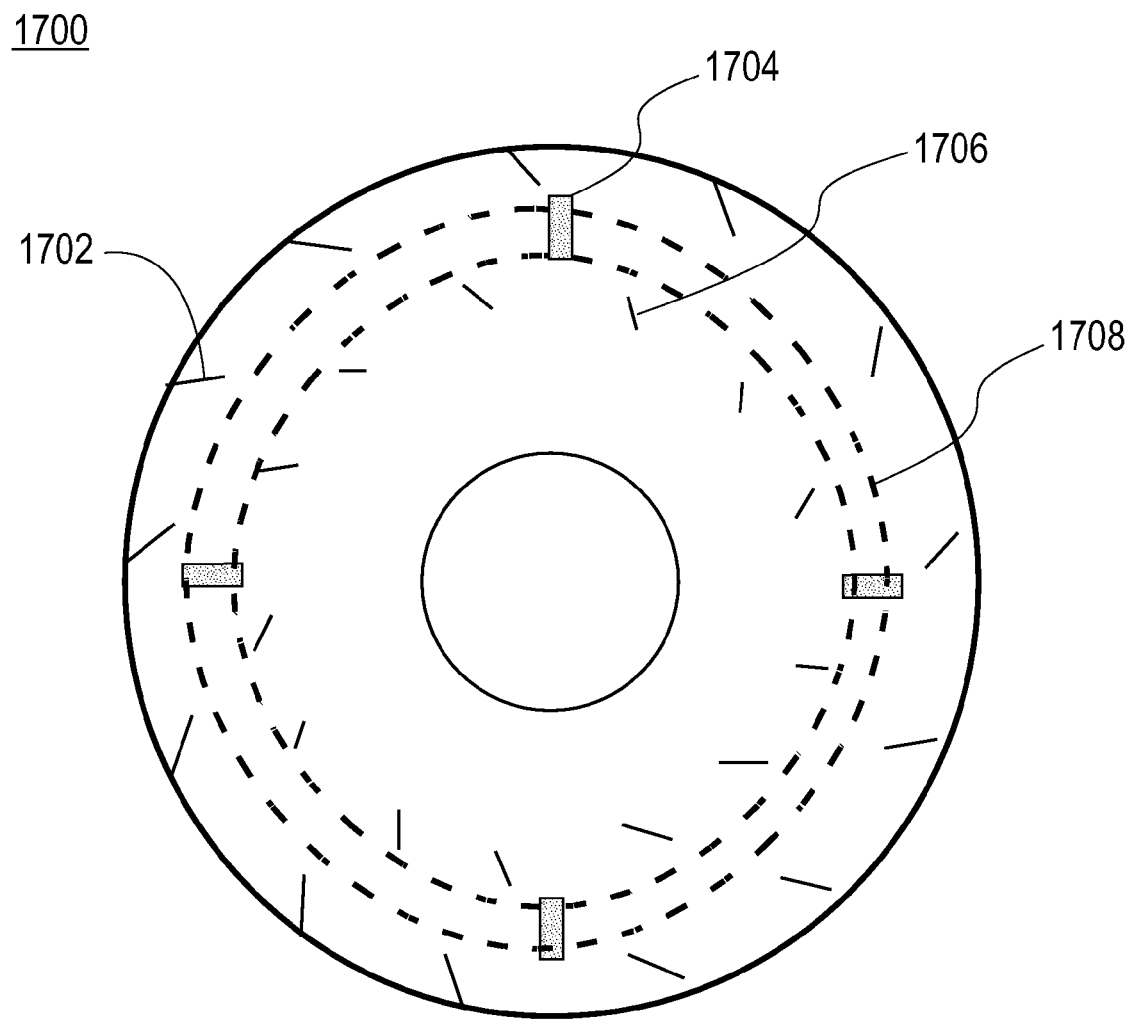
FIG. 17 shows flow generating blades at outer and inner diameters.

FIG. 17 shows a case of a disc 1700 where the air flow is generated by an inner and outer ring of flow generating blades 1702 and 1706 where the heat dissipating fins 1708 are sandwiched between them. A set of stationary baffles 1704 is also shown.

Figure 18A:
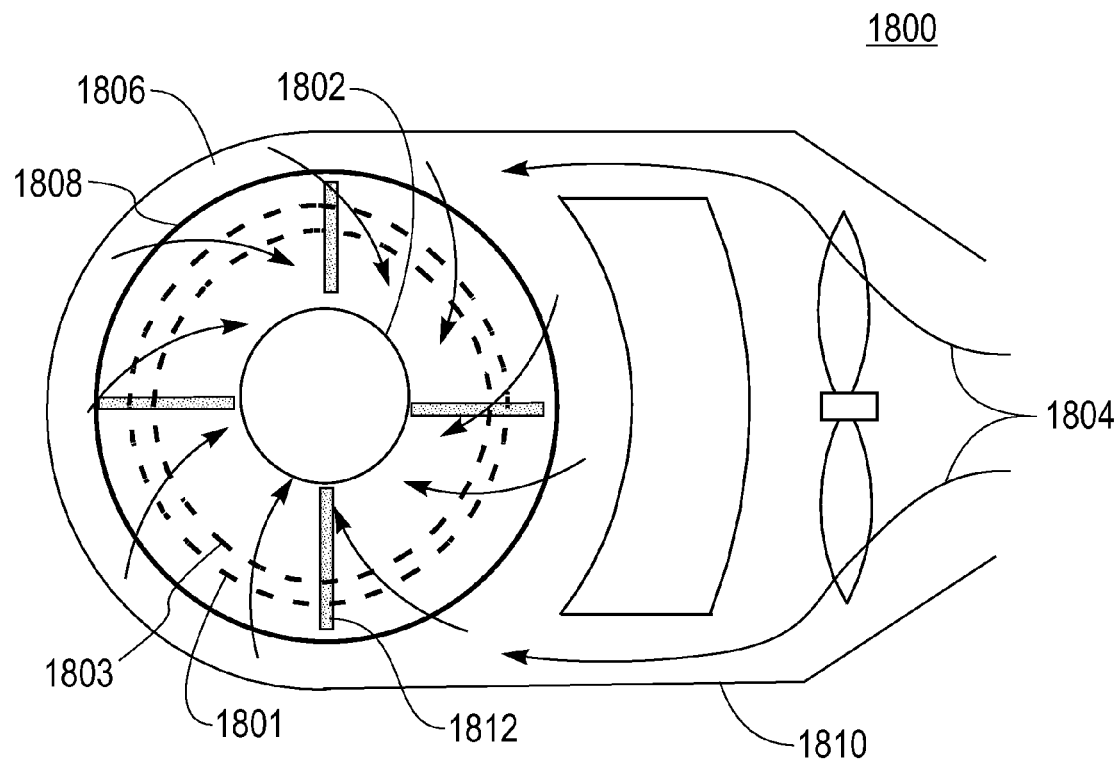
FIGS. 18A and 18B show an embodiment where the air for cooling is supplied from an outer diameter toward an inner diameter by an externally pressurized plenum.
Figure 18B:
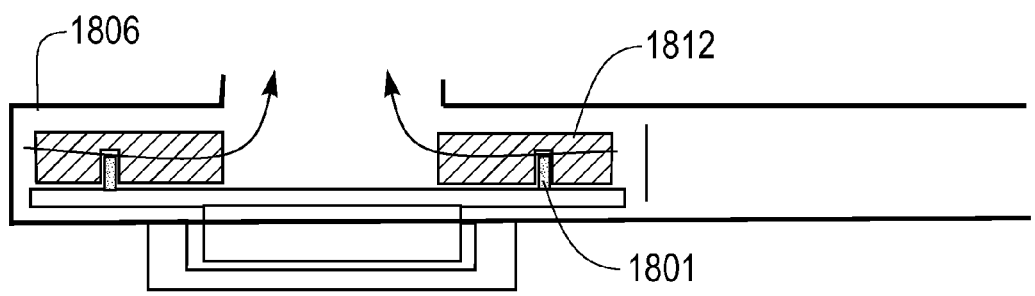

FIGS. 18A and 18B show an embodiment 1800 where the air for cooling is supplied from outer diameter toward inner diameter by an externally pressurized plenum 1806. This configuration allows the unheated air to interact with the out fins 1801 (as opposed to the inner fins 1803) first where the maximum heat dissipation potential exists. An external air supply 1804 provides the air flow into a kinetic heat sink 1808 and the air exits from a vent 1802 along an axial direction. A shroud 1810 provides the outer cover. A set of baffles 1812 are also shown. FIG. 18B is a cross section of the KHS of FIG. 18A.

Therefore, while there has been described what is presently considered to be the preferred embodiment, it will understood by those skilled in the art that other modifications can be made within the spirit of the invention.

We claim:

1. A cooling system comprising:
   a moving rotor system comprising:
      a disk comprising:
         a blade assembly comprising rotating blades for dissipating heat, said rotating blades moving through ambient fluid; and
         a plurality of heat conducting structures distributed in a circular pattern around the disk, the heat conducting structures having a high aspect ratio that maximizes a surface area to footprint area;
         wherein the heat conducting structures comprise arc-shaped thin-fins with a rectangular cross-section; and
         wherein the rotating blades generate a mass fluid flow of the ambient fluid over the heat conducting structures so that the heat conducting structures are persistently cooled.

2. The cooling system of claim 1 wherein the rotating blades are arranged in a spiral pattern.

3. The cooling system of claim 1 further comprising a baffle to reduce a swirl component of the fluid.

4. A cooling system comprising:
   a mechanism to direct mass fluid flow radially outward, thereby reducing a swirl component of ambient fluid; and
   a moving rotor system comprising:
      a disk comprising:
         a plurality of heat conducting structures distributed in a circular pattern around the disk, the heat conducting structures having a high aspect ratio that maximizes a surface area to footprint area;
         a blade assembly comprising a first set of rotating blades moving through the ambient fluid;
         wherein the heat conducting structures comprise arc-shaped thin-fins with a rectangular cross-section; and
         wherein the first set of rotating blades are disposed along an inner edge of the circular pattern and generate a mass fluid flow of the ambient fluid over the heat conducting structures so that the heat conducting structures are persistently cooled.

5. The cooling system of claim 4 where the mechanism to direct the mass fluid flow has multiple radial instantiations.

6. The cooling system of claim 5 where each radial instantiation is a comb-like structure which enhances heat dissipation by stripping the fluid boundary layer as each fin moves through.

7. The cooling system of claim 4 where the mechanism to direct the mass fluid flow radially out of the system, thereby reducing the swirl component of fluid, comprises a set of baffles.

\* \* \* \* \*